United States Patent
Choi

(10) Patent No.: US 6,979,825 B1
(45) Date of Patent: Dec. 27, 2005

(54) QUANTUM-GRID INFRARED PHOTODETECTOR (QGIP) SPECTROMETERS AND RELATED METHODS

(75) Inventor: Kwong-Kit Choi, Brookeville, MD (US)

(73) Assignee: The United States of America as represented by the Secretary of the Army, Washington, DC (US)

(*) Notice: Subject to any disclaimer, the term of this patent is extended or adjusted under 35 U.S.C. 154(b) by 159 days.

(21) Appl. No.: 10/411,232

(22) Filed: Apr. 11, 2003

(51) Int. Cl.[7] .......................... H01L 27/144
(52) U.S. Cl. ................................. 250/338.4
(58) Field of Search .................... 250/338.4

(56) References Cited

U.S. PATENT DOCUMENTS

| | | |
|---|---|---|
| RE34,649 E | 6/1994 | Choi |
| 5,384,469 A | 1/1995 | Choi |
| 5,485,015 A | 1/1996 | Choi |
| 5,539,206 A | 7/1996 | Schimert |
| 6,180,990 B1 | 1/2001 | Claiborne et al. |
| 6,271,537 B1 * | 8/2001 | Gunapala et al. ............. 257/21 |
| 6,502,167 B1 | 12/2002 | Tanaka et al. |
| 6,580,089 B2 * | 6/2003 | Bandara et al. ............... 257/14 |
| 2003/0011840 A1 * | 1/2003 | Mitra ........................ 359/124 |
| 2004/0108564 A1 * | 6/2004 | Mitra ........................ 257/442 |

FOREIGN PATENT DOCUMENTS

EP       0 999 600 A2     5/2000

OTHER PUBLICATIONS

Choi, K.K., "Detection Wavelength of InGaAs/AiGaAs Quantum Wells and Superlattices," Journal of Applied Physics, vol. 91, No. 2, Jan. 15, 2002.

* cited by examiner

*Primary Examiner*—Constantine Hannaher
(74) *Attorney, Agent, or Firm*—William V. Adams

(57) ABSTRACT

A plurality of quantum-grid infrared photodetector (QGIP) elements are concatenated to form a spectrometer. Each of the QGIP elements is adapted to detect light at a particular range of wavelengths. Additionally, each QGIP element is adapted to produce a photocurrent that is proportional to the amount of light detected at its respective range of wavelengths. This type of configuration permits spectrometry within a spectrum that spans the aggregate ranges of wavelengths of each QGIP element.

29 Claims, 14 Drawing Sheets

QUANTUM-GRID INFRARED PHOTODETECTOR (QGIP) SPECTROMETERS AND RELATED METHODS

GOVERNMENT INTEREST

The invention described herein may be manufactured, used, and licensed by or for the United States Government.

TECHNICAL FIELD

The present disclosure relates generally to spectrometry and, more particularly, to infrared spectrometry.

DESCRIPTION OF RELATED ART

Spectrometers are commonly used to characterize or identify chemicals and biological specimens in laboratories. Spectrometers are also used to characterized semiconductor materials and optical materials.

Many conventional spectrometers, such as Fourier Transform (FT) infrared (IR) spectrometers, are expensive, bulky, and fragile. Often, optical elements such as diffraction gratings or prisms are used in conventional spectrometers to separate incident light into its various wavelength components. For many conventional spectrometers, a source generates light across the spectrum of interest and a monochromater (e.g., diffraction grating or prism) separates the source radiation into its various wavelengths. A slit selects a collection of wavelengths that shine through a sample at any given time. The sample absorbs light according to its chemical properties, and a detector collects the radiation that passes through the sample. The detector outputs an electrical signal, which is normally sent directly to an analog recorder, thereby allowing recordation of energy as a function of frequency or wavelength.

For such spectrometers, the use of optical elements often results in optical attenuation, thereby reducing system sensitivity. Given these deficiencies in conventional spectrometers, it is desirable to have alternatives. For example, it is desirable to have spectrometers that are comparatively inexpensive, portable, and robust.

SUMMARY

The present disclosure provides spectrometers and related methods.

Briefly described, an embodiment of a spectrometer comprises a plurality of quantum-grid infrared photodetector (QGIP) elements. Each QGIP element is adapted to detect energy at a particular range of wavelengths and generate a photocurrent that is proportional to the energy detected at that particular range of wavelengths.

An embodiment of a method comprises the steps of detecting energy at a plurality of quantum-grid infrared photodetector (QGIP) elements and generating photocurrents in response to the detected energy. The detected energy is defined by a plurality of wavelengths that, in the aggregate, form a substantially continuous spectrum. Each photocurrent is proportional to the detected energy at one range of wavelengths.

Other systems, methods, features and/or advantages will be or may become apparent to one with skill in the art upon examination of the following drawings and detailed description. It is intended that all such additional systems, methods, features and/or advantages be included within this description.

BRIEF DESCRIPTION OF THE DRAWINGS

Many aspects of the disclosure can be better understood with reference to the following drawings. The components in the drawings are not necessarily to scale, emphasis instead being placed upon clearly illustrating the principles of the present disclosure. Moreover, in the drawings, like reference numerals designate corresponding parts throughout the several views.

DETAILED DESCRIPTION

Figure 1A:
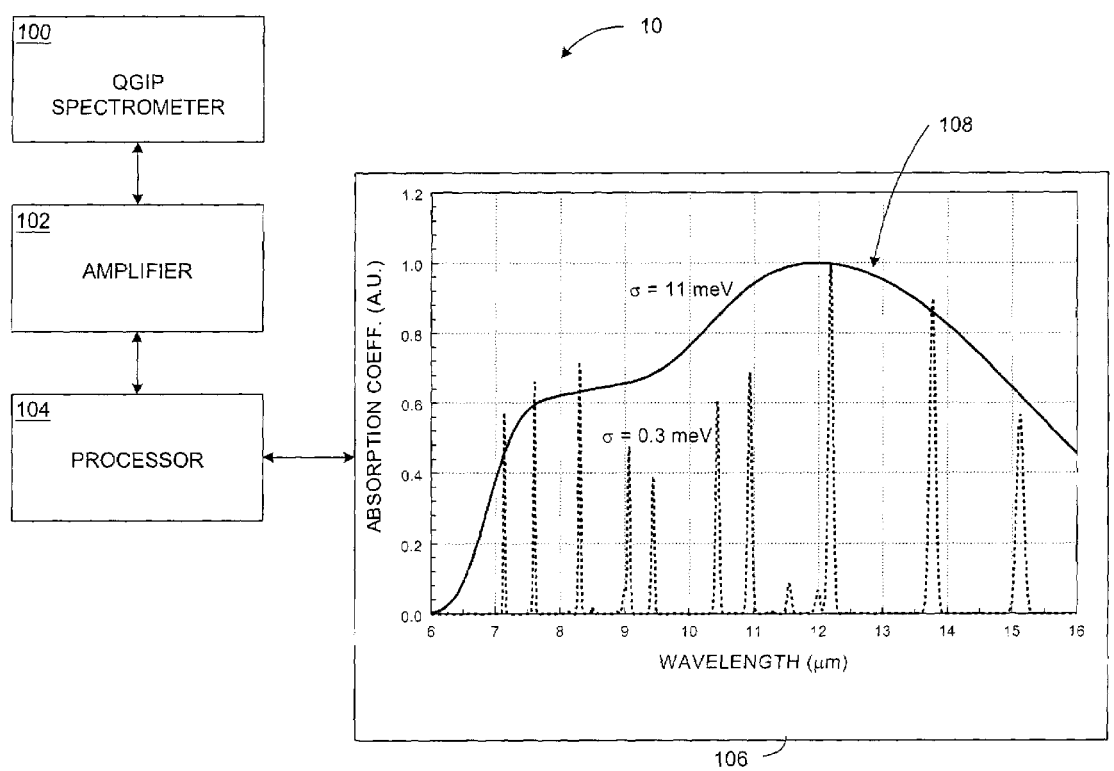
FIG. 1A is a diagram showing a spectroscopy system having a quantum-grid infrared photodetector (QGIP) spectrometer that performs infrared (IR) spectrometry.

Quantum-grid infrared photodetector (QGIP) elements are relatively small and inexpensive devices that can be configured to detect energy at various wavelengths. QGIP elements typically detect light at a particular wavelength (or particular range of wavelengths) due to their inherent light-scattering properties. The properties of QGIP elements are discussed in detail in U.S. Pat. No. 5,485,015, which is incorporated herein by reference as if set forth in its entirety. Thus, only a truncated discussion of the properties of QGIP elements is provided here. For reasons discussed below, the characteristics of QGIP elements can permit construction of fairly cost-effective, portable, and robust spectrometers. Consequently, a spectroscopy system that employs a spectrometer having QGIP elements in robust and compact due to advantageous features provided by the QGIP elements.

Reference is now made in detail to the description of the embodiments as illustrated in the drawings. While several embodiments are described in connection with these drawings, there is no intent to limit the invention to embodiments disclosed herein. On the contrary, the intent is to cover all alternatives, modifications, and/or equivalents.

FIG. 1A is a diagram showing an embodiment of a spectroscopy system 10 having a quantum-grid infrared photodetector (QGIP) spectrometer 100 that performs infrared (IR) spectroscopy. As shown in FIG. 1A, the spectroscopy system 10 also includes an amplifier 102, e.g., an amplifier circuit, a processor 104, e.g., a processing circuit, and a display 106. For reasons discussed below, the QGIP spectrometer 100 detects a spectrum of wavelengths and generates photocurrents that are proportional to the wavelengths (or ranges of wavelengths) detected by the QGIP spectrometer 100. The generated photocurrents are provided to an amplifier circuit 102 that amplifies the photocurrents. The amplified photocurrents are provided to the processing circuit 104, which measures and processes the amplified photocurrents. Upon processing, a spectrum 108 is displayed at the display 106.

As is shown in FIG. 1A, the displayed spectrum 108 depicts a distribution of detected wavelengths. In other embodiments, information acquired by the QGIP spectrometer 100 may be displayed in other formats. The amplifier circuit 102, the processing circuit 104, and the display 106 comprise part of a conventional spectroscopy system. In this regard, the QGIP spectrometer 100 may replace an IR detector from a conventional spectroscopy system.

Figure 1B:
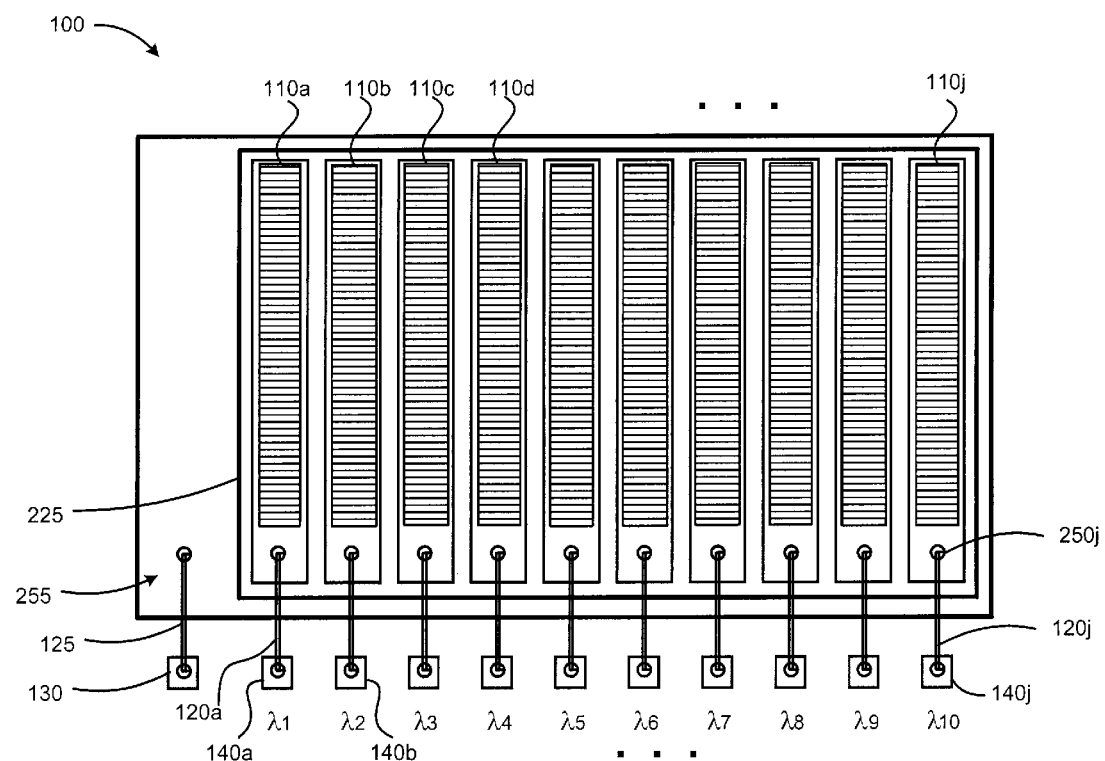
FIG. 1B is a diagram showing a top view of an embodiment of the QGIP spectrometer of FIG. 1A.

FIG. 1B is a diagram showing a top view of an embodiment of the QGIP spectrometer 100 of FIG. 1A. In this embodiment, the QGIP spectrometer 100 comprises ten QGIP elements 110a . . . 110j (hereinafter simply referred to as "QGIP element(s) 110"). Each of the QGIP elements 110 is electrically coupled to a common substrate 225. As described in greater detail below, each of the QGIP elements 110 is configured to detect energy (also referred to herein as radiation or incident light) over a particular range of wavelengths (λ). The common substrate 225 is electrically coupled to a metal layer 255 that is deposited around the QGIP elements 110. The QGIP elements 110 are electrically coupled to top contact-bonding pads 140a . . . 140j (hereinafter simply referred to as "contact-bonding pad(s) 140") using wire bonding 120a . . . 120j (hereinafter simply referred to as "wire bonding 120"). Additionally, the QGIP elements 110 are electrically coupled to a common bottom contact-bonding pad 130 via the substrate 225 and metal layer 255 using wire bonding 125. The electrical coupling of the QGIP elements 110 to the contact-bonding pads 130, 140 facilitates detection of photocurrents that are generated by the QGIP elements 110 in response to detecting incident light at several different ranges of wavelengths. Thus, once the QGIP elements 110 generate photocurrents as a result of detecting the incident light, the generated photocurrents are provided to the amplifier circuit 102 via the contact-bonding pads 130, 140. Since the operation of each QGIP element 110 is described in greater detail in FIGS. 2A through 4C, only a truncated discussion of the operation of the QGIP elements 110 is provided with reference to FIG. 1B.

In some embodiments, the area of each QGIP element 110 is approximately 150×1150 $\mu m^2$. Thus, the QGIP spectrometer 100 of FIG. 1 may be fabricated within a very compact area. The incident light detected by each QGIP element 110 is introduced through the substrate 225. In other words, the incident light propagates through the substrate 225 prior to detection. Therefore, at least a portion of the substrate 225 is optically transparent with respect to the range of wavelengths that are to be detected. Hence, during fabrication, the metal layer 255 is deposited around the array of QGIP elements 110 so that the incident light is unobstructed when entering the QGIP elements 110 through the substrate 225. Photocurrents from each QGIP element 110 are independently measured by current amplifiers (not shown), which reside in the amplifier circuit 102.

Since the ten QGIP elements 110 detect energy at ten different ranges of wavelengths for the QGIP spectrometer 100 of FIG. 1B, ten sets of photocurrents are generated, each of which is proportional to the energy at one of the ten different ranges of wavelengths. If the ten different ranges of wavelengths are relatively close to each other, then the aggregate of the wavelengths forms a substantially continuous spectrum. Consequently, measurement of the photocurrents generated by the QGIP elements 110 results in a spectroscopic measurement of the incident light. The compact nature of the QGIP spectrometer 100 provides a very compact and portable spectroscopy system for performing spectroscopic measurements.

Figure 2A:
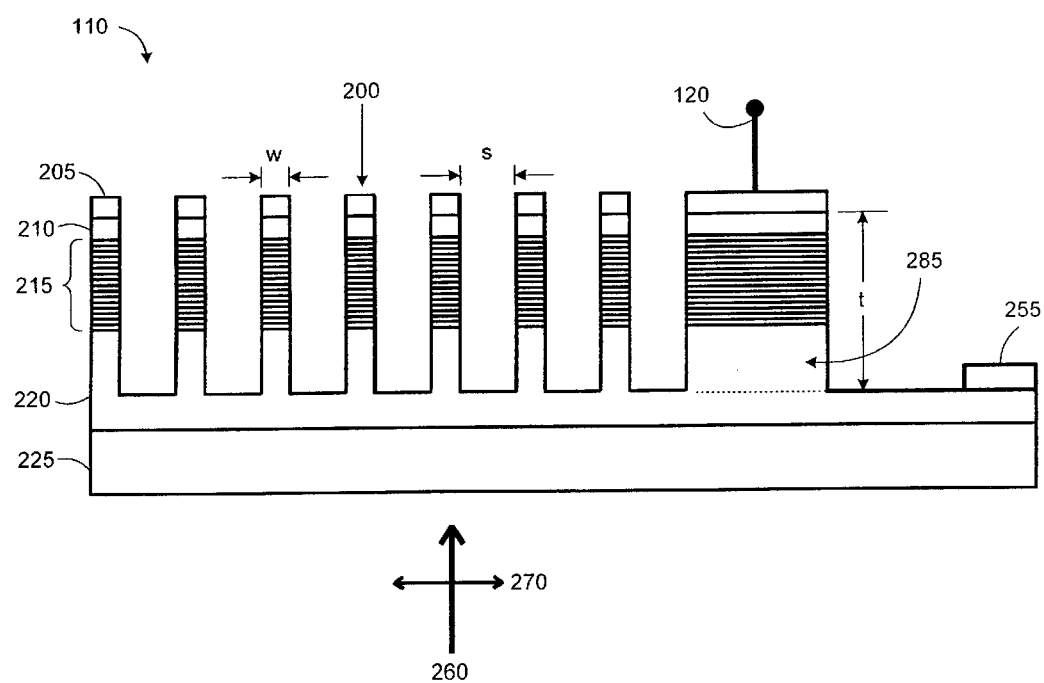
FIG. 2A is diagram showing a side view of a QGIP element in the QGIP spectrometer of FIG. 1B.

FIG. 2A is diagram showing a side view of a QGIP element 110 in the QGIP spectrometer 100 of FIG. 1B. As shown in FIG. 2A, the QGIP element 110 comprises a plurality of gridlines 200. Each gridline 200 comprises a top metal layer 205, a top contact layer 210, a superlattice 215, a bottom contact layer 220, and a substrate 225. For reasons provided below, the superlattice 215 detects light at a particular wavelength and generates a photocurrent that is proportional to the detected light.

Each QGIP element 110 comprises a grid pattern of metal that is first deposited on top of a quantum-well infrared photodetector (QWIP) material. Since QWIP materials are discussed in detail in U.S. Pat. Nos. 5,485,015 and Re 34,649, which are incorporated herein by reference as if set forth in their entireties, only a truncated discussion of QWIP material is presented here. The grid pattern of metal serves as the top metal layer 205 and also as a mask for etching (e.g., plasma etching, etc.). The QWIP material has a number of layers that constitute a superlattice active region. Using the mask, the QWIP material is etched vertically through the superlattice active region and down into a portion of the bottom contact layer. The etching process results in a number of gridlines 200 having superlattices 215. An unetched portion 285 resides on one side of the QGIP element 110 for the purpose of wire bonding. Another layer of metal 255 is deposited on the bottom contact layer surrounding the QGIP element 110. As described above, this layer of metal 255 is deposited around the QGIP elements 110 to provide unobstructed access of incident light 260 to the superlattices 215. As is known, the propagating incident light 260 defines an optical-electric field 270 that is perpendicular to the propagation direction of the incident light 260. The metal contacts 205, 255 are subsequently annealed to provide ohmic contacts.

The result of the fabrication process yields a lamellar grid pattern as shown in FIG. 2A. In other words, the fabrication process yields a plurality of gridlines 200 that each has a fixed width (w), a fixed depth (t), and a fixed spacing (s). While a three-dimensional perspective view of the QGIP element 110 having a lamellar grid pattern is shown in FIG. 2B, it should be appreciated that a cross-grid pattern or other equivalent patterns may also be used to generate the QGIP element 110.

Figure 2B:
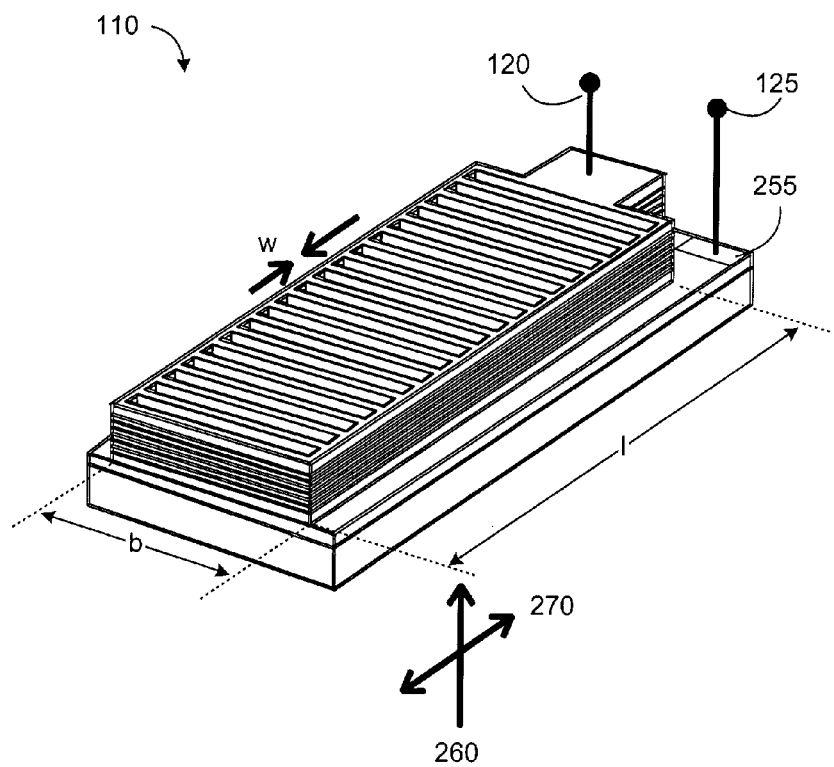
FIG. 2B is a diagram showing a perspective view of a QGIP element in the QGIP spectrometer of FIG. 1B.

As shown in FIG. 2B, the lamellar grid pattern of the QGIP element 110 includes gridlines 200 of a fixed length (l) that are arranged in a linear array across the breadth (b) of the QGIP element 110. The two ohmic contacts (e.g., wire bonding 125, 120) are shown in FIG. 2B at one end of the QGIP element 110. The length (l) of the gridlines 200 and the number of gridlines 200 in a QGIP element 110 do not significantly affect light-coupling characteristics (e.g., light absorption, resonant scattering of light, etc.) of the QGIP element 110. However, the width (w) of the gridlines 200 affects light-coupling characteristics of the QGIP element 110. In some embodiments, it is desirable to have the width (w) of the gridlines 200 be an odd multiple of the half-wavelength of the detection wavelength in the superlattice material. In other words, if the superlattice material is adapted to detect a wavelength of $\lambda$, then the width (w) of the gridline 200 should be approximately:

$$w = \frac{N\lambda_s}{2}, \quad \text{[Equation 1]}$$

where N is an odd integer and $\lambda_s$ is the incident wavelength in the material. The incident wavelength of the material is defined as:

$$\lambda_s = \frac{\lambda}{\sqrt{\varepsilon}}, \quad \text{[Equation 2]}$$

where $\lambda$ is the wavelength in free space and $\varepsilon$ is the dielectric constant of the material. Given Equations 1 and 2, the metal layer 205 on top of each gridline 200 acts as a resonant multi-pole antenna due to the selected width (w). The resonant properties of the metal layer 205 result in scattering of any incident light 260 that enters through the substrate 225. In other words, the width (w) of the metal layer 205 on each gridline 200 defines a scattered field, which further defines the absorption characteristics of the QGIP element 110.

Figure 2C:
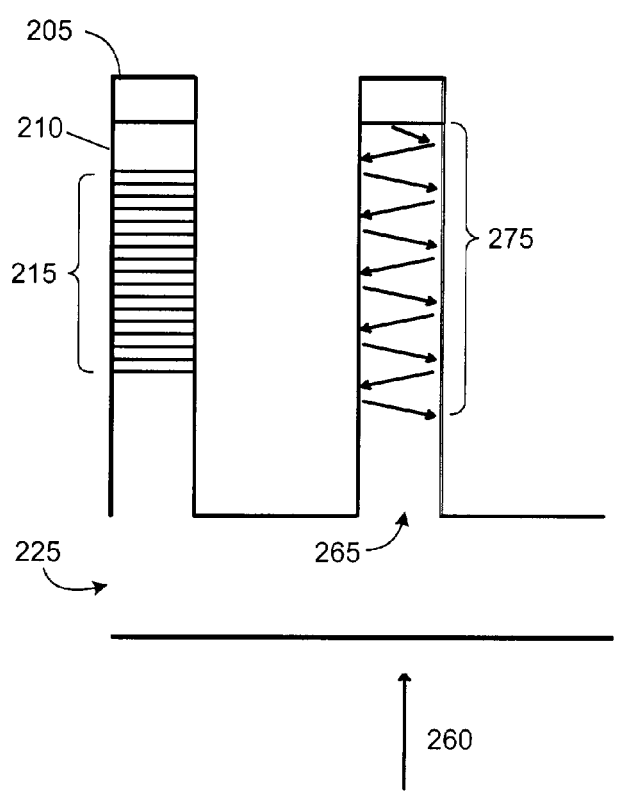
FIG. 2C is a diagram showing an exploded view of a gridline from the QGIP element of FIGS. 2A and 2B.

As shown in FIG. 2C, the gridlines 200, in addition to being the active absorbing material, also provide a two-fold function. First, the gridlines 200 behave as dielectric waveguides 265 for normal incident light 260. Second the gridlines 200 behave as resonators for scattered light 275. In operation, as incident light 260 enters through the substrate 225, each gridline 200 directs the incident light 260 through the superlattice 215 to the top metal layer 205. In this regard, the gridline 200 behaves as a dielectric waveguide 265 for the incident light 260. Upon being directed to the top metal layer 205, the light is reflected and scattered by the metal layer 205. The reflected and scattered light 275 resonates through each of the gridlines 200 and is absorbed by the superlattice 215 structure of the gridlines 200.

Due to the selected width (w), the wave-guiding properties of the gridlines 200 have fundamental modes of approximately $$\frac{N\lambda_s}{2}.$$

Since the fundamental modes of the waveguide 265 are integer multiples of half-wavelengths, these wave-guiding properties further strengthen the scattered field at the multi-pole resonant wavelengths and sharpen the absorption width for each QGIP element 110.

Electromagnetic simulations have shown that the optical absorption increases and the absorption bandwidth decreases when the height (t) of the gridlines 200 increases. Additionally, beyond a certain gridline height (t), the absorption decreases with increasing height (t). In other words, according to simulation results, an optimum wavelength-dependent gridline depth (t) exists. For example, for $\lambda$ of approximately 9 $\mu$m, the optimum gridline depth (t) would be approximately 3.0 $\mu$m. Since each gridline 200 also affects the scattering field of other gridlines 200, the spacing (s) between gridlines 200 should, preferably, be large. Simulations have shown that a gridline spacing of between approximately 3 $\mu$m to approximately 5 $\mu$m should be adequate to isolate scattering fields from adjacent gridlines 200.

In one simulation, when the spectrometer 100 of FIG. 1B was designed to detect wavelengths ($\lambda$) of approximately:

$$\lambda = \{7.5, 8, 8.5, 9, 9.5, 10, 10.5, 11, 11.5, 12\,\mu\text{m}\} \quad \text{[Equation 3]},$$

each QGIP element was configured to have corresponding gridline widths (w) of approximately:

$$w = \{3.45, 3.74, 4.03, 4.32, 4.61, 4.9, 5.19, 5.48, 5.77, 6.06\,\mu\text{m}\} \quad \text{[Equation 4]},$$

a gridline spacing (s) of approximately 3 $\mu$m, and a gridline depth (t) of approximately 3 $\mu$m. The electromagnetic simulations showed that the full-width-at-half-maximum ($\Gamma$) of the detected peak was approximately 0.8 $\mu$m when the spectrometer 100 had a resonance of N=3.

In another simulation, when the spectrometer 100 was designed to detect at wavelengths of approximately:

$$\lambda = \{6, 7, 8, 9, 10, 11, 12, 13, 14, 15\,\mu\text{m}\} \quad \text{[Equation 5]},$$

each QGIP element 110 was configured to have corresponding gridline widths (w) of approximately:

$$w = \{0.736, 0.942, 1.148, 1.354, 1.56, 1.766, 1.972, 2.178, 2.384, 2.59\,\mu\text{m}\} \quad \text{[Equation 6]},$$

and a gridline spacing (s) of approximately 5 $\mu$m. Here, the spectrometer 100 utilized an N=1 dipole resonance, and the calculated $\Gamma$ was approximately 0.7 $\mu$m when the gridline depth (t) was approximately 3 $\mu$m.

Figure 3A:
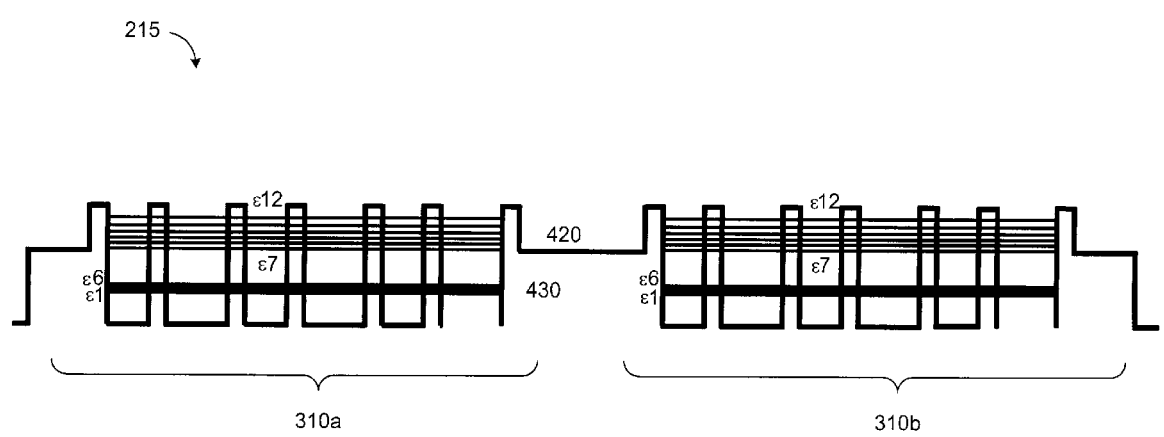
FIG. 3A is a diagram showing a superlattice of FIGS. 2A through 2C in greater detail.

FIG. 3A shows the superlattice 215 of FIGS. 2A through 2C in greater detail. As mentioned above, the superlattice 215 absorbs the incident light at the various wavelengths. The superlattice 215 comprises a number of superlattice units 310a, 310b (simply referred to herein as "superlattice unit(s) 310"), which individually absorb the incident light at a given wavelength. Each superlattice unit 310 is defined by a lower miniband 430 of degenerate energy states and an upper miniband 420 of degenerate energy states. If each of the superlattice units 310 is substantially identical, then all of the superlattice units 310 will have similar electron-transfer characteristics. The electron-transfer characteristics of each of the superlattice units 310 permit detection of various wavelengths by each of the QGIP elements 110. The structure of the superlattice unit 310 and details of the minibands 420, 430 are discussed in greater detail with reference to FIG. 4A.

Figure 3B:
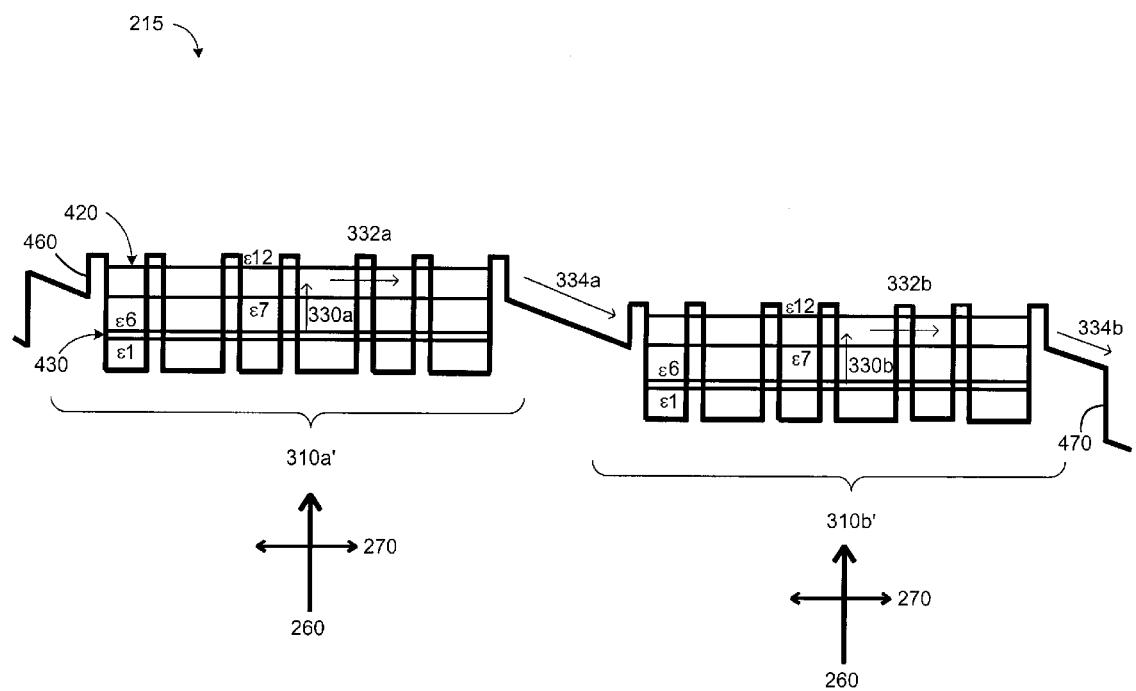
FIG. 3B is a diagram showing the superlattice of FIG. 3A when a bias voltage is applied across the superlattice.

FIG. 3B provides an example of electron transfer under an applied bias. As shown in FIG. 3B, when the superlattice 215 is irradiated with incident light 260, an electron in the lower miniband 430 may make an optical transition 330a to the upper miniband 420. If a bias is applied to the superlattice 215, then, upon transitioning 330a to the upper miniband 420, the electron migrates 332a, 334a across the upper miniband 420 from one superlattice unit 310a to another superlattice unit 310b. While the photocurrents flow in the upper miniband 420, dark currents due to doped electrons flow in the lower miniband 430. In order to block the flow of the dark currents between superlattice units 310, superlattice barriers 460, 470 are placed at both ends of the superlattice unit 310. The barrier heights of the superlattice barriers 460, 470 are chosen to be lower than the lower degenerate energy level $\epsilon_7$ of the upper miniband 420 but higher than the upper degenerate energy level $\epsilon_6$ of the lower miniband 430. Thus, only the dark current is obstructed while the photocurrent is permitted to flow between the superlattice units 310. The flowing photocurrents are then measured to determine the absorbed ranges of wavelengths and, consequently, the resulting spectrum.

Figure 4A:
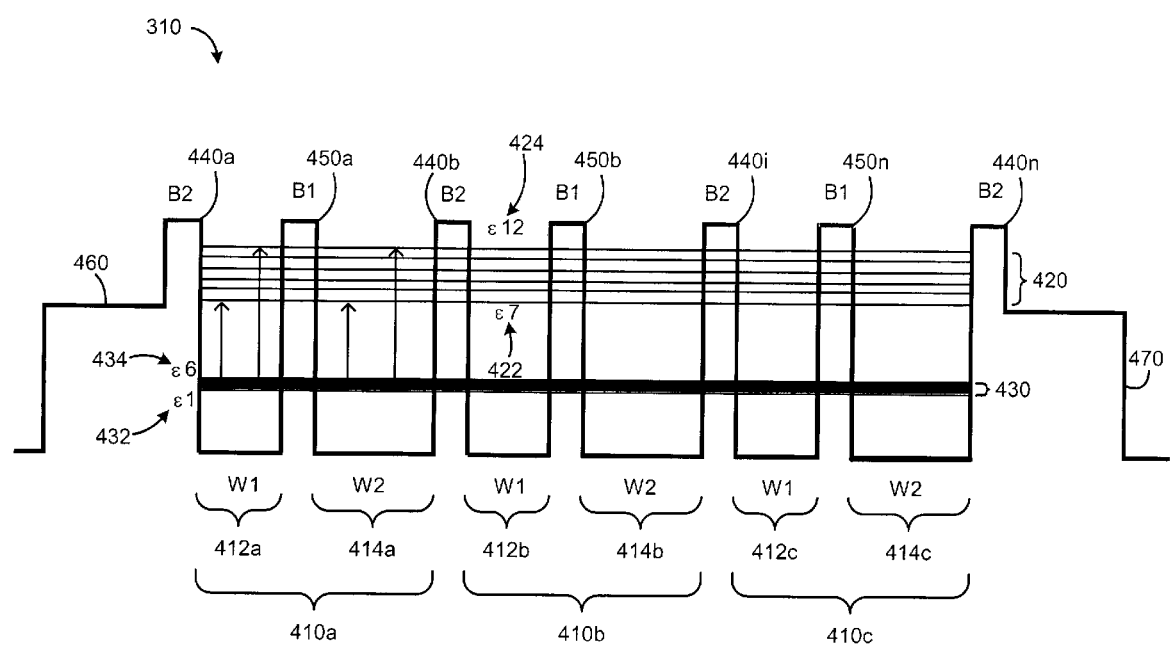
FIG. 4A is a diagram showing the superlattice unit of FIGS. 3A and 3B in greater detail.

FIG. 4A is a diagram showing the superlattice unit 310 of FIGS. 3A and 3B in greater detail. While specific energy characteristics of components within the superlattice unit 310 are described in detail with reference to FIGS. 4B and 4C, energy characteristics are discussed broadly with reference to FIG. 4A to provide an overview of the operation of the superlattice 310.

As shown in FIG. 4A, the superlattice unit 310 comprises a number of basis units 410a, 410b, 410c (hereinafter simply referred to as "basis units 410"). In some embodiments, the basis unit 410 is a binary basis unit that comprises two quantum wells 412, 414. However, it should be appreciated that the basis unit 410 may be a single quantum well, a ternary quantum well, or a basis unit 410 having any integer value k as a basis.

The superlattice unit 310 further comprises several relatively thin inter-unit barriers (B2) 440a ... 440n (hereinafter simply referred to as "inter-unit barrier(s) 440"). Each inter-unit barrier 440 separates adjacent basis units 410. Additionally, each inter-unit barrier 440 permits energy coupling between adjacent basis units 410. In the embodiment of FIG. 4A, the basis units 410 are binary basis units 410 that each having a first quantum well 412a ... 412c (hereinafter simply referred to as "first quantum well(s) 412") and a second quantum well 414a ... 414c (hereinafter simply referred to as "second quantum well(s) 414"). The first quantum well 412 and the second quantum well 414 may be manufactured using quantum-well infrared photodetector (QWIP) material. In each binary basis unit 410, the first quantum well 412 is separated from the second quantum well 414 by an inter-well barrier (B1) 450a ... 450n (hereinafter simply referred to as "inter-well barrier(s) 450"). Similar to the inter-unit barriers 440, the inter-well barriers 450 are relatively thin barriers that permit well-to-well energy coupling.

The inter-well energy coupling and the inter-unit energy coupling result in a degeneration of energy levels. The degeneration of energy levels forms the minibands 420, 430. The upper miniband 420 of energy levels are grouped together at approximately the upper energy level of the quantum well while the lower miniband 430 of energy levels are grouped together at approximately the lower energy level of the quantum well. Hence, the degeneration of energy levels manifests itself as a separation of energy (or wavelength) peaks in a spectrum. As shown in FIG. 4A, for three binary basis units 410, the lower miniband 430 has six degenerate energy levels that range from a lower degenerate energy level of $\epsilon1$ through an upper degenerate energy level of $\epsilon6$. Similarly, the three binary basis units 410 result in an upper miniband 420 having six degenerate energy levels that range from a lower degenerate energy level of $\epsilon7$ through an upper degenerate energy level of $\epsilon12$. These degenerate energy levels are described in greater detail by Choi et al. in "QWIP Structural Optimization," (hereinafter "the SPIE reference") presented at the 47th Annual Meeting of the SPIE, held on Jul. 7 through 13, 2002 in Seattle, Wash. The SPIE reference is incorporated herein by reference as if set forth in its entirety. Additionally, the formation of the degenerate energy levels is described in greater detail with reference to FIGS. 4B and 4C.

The superlattice unit 310 further comprises superlattice barriers 460, 470, which are located at each end of the superlattice unit 310. As discussed above, the superlattice barriers 460, 470 are adapted to prevent electron transfer between the lower minibands 430 of the superlattice units 310 while permitting electron transfer between the upper minibands 420 of the superlattice units 310.

A specific example of a broadband QWIP material may have parameters adapted to detect between an approximately 7 $\mu$m- to 15 $\mu$m-wavelength range. In one embodiment of a binary basis unit 410, the wells 412, 414 are made of GaAs while the inter-well barriers 450 are made of $Al_{0.27}Ga_{0.73}As$. In that embodiment, the well thicknesses are approximately 70 Å and 75 Å, respectively, and the inter-well barrier thickness is approximately 25 Å. The inter-unit barriers are made of $Al_{0.27}Ga_{0.73}As$, and the inter-unit barrier thickness is approximately 25 Å. Given an absorption line broadening ($\sigma$) of approximately 11 meV, four basis units 410 are typically needed to obtain a smooth absorption spectrum. With approximately 11 meV in line broadening, the QWIP material maintains a relatively uniform absorption between approximately 7 $\mu$m to approximately 15 $\mu$m wavelength range.

An example embodiment of the superlattice 215 comprises eight periods of superlattice units 310. Each superlattice unit 310 comprises four periods of binary basis units 410, and each superlattice unit 310 is separated from an adjacent superlattice unit 310 by an approximately 600 Å undoped $Al_{0.19}Ga_{0.81}As$ superlattice barrier 460, 470 and an approximately 25 Å undoped $Al_{0.27}Ga_{0.73}As$ inter-unit barrier 440. Each binary basis unit 410 comprises an approximately 70 Å GaAs well 412, an approximately 25 Å $Al_{0.27}Ga_{0.73}As$ inter-well barrier 450, and an approximately 75 Å GaAs well 414. Each binary basis unit 410 is separated from adjacent binary basis units 410 by an approximately 25 Å $Al_{0.27}Ga_{0.73}As$ inter-unit barrier 440. All of the barriers and the wells have a Si doping density of approximately $4\times10^{17}$ cm$^{-3}$. The eight-period superlattice units 310 are sandwiched between an approximately 1000 Å GaAs top contact layer 210 and an approximately 2.5 $\mu$m GaAs bottom contact layer 220, both doped to approximately $4\times10^{17}$ cm$^{-3}$. The material layers are grown on a GaAs semi-insulating substrate.

Figure 4B:
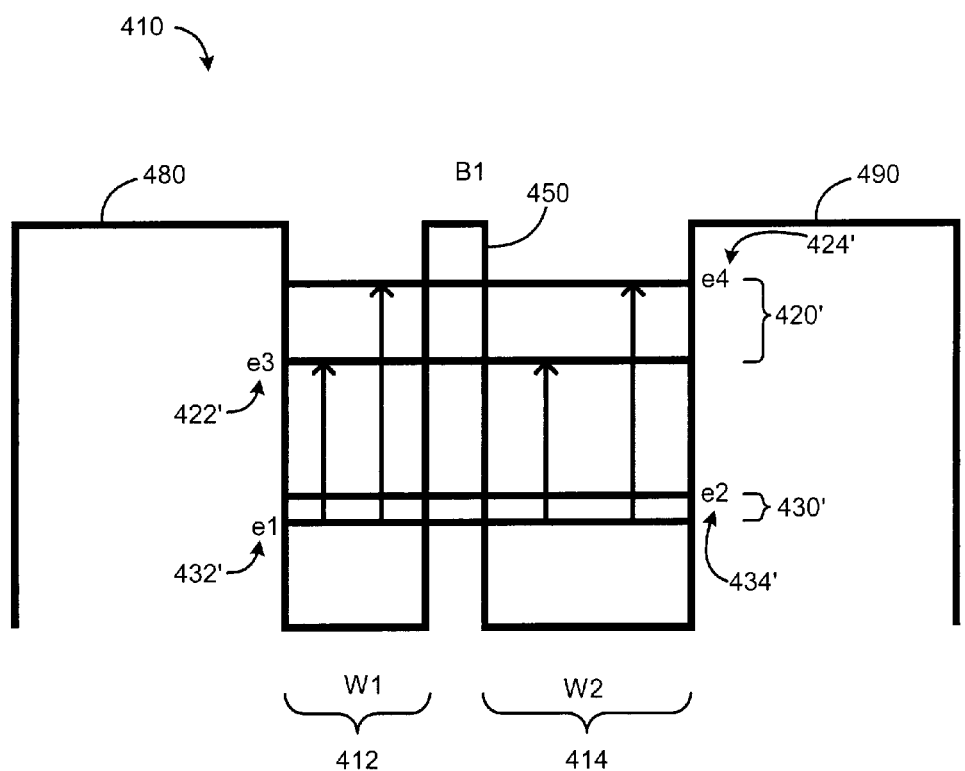
FIG. 4B is a diagram showing an exploded view of a binary basis unit of FIG. 4A in greater detail.
Figure 4C:
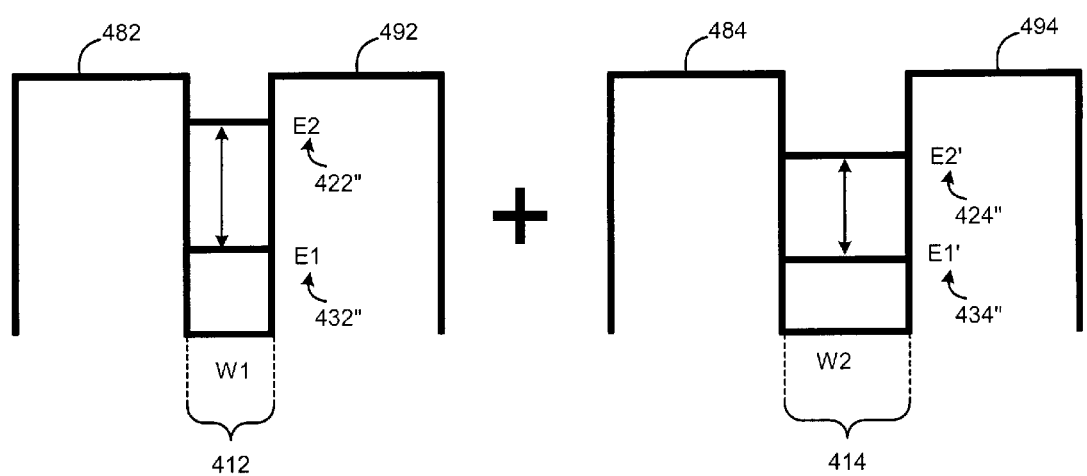
FIG. 4C is a diagram showing two quantum wells of FIG. 4B in greater detail.

FIGS. 4B and 4C are diagrams that show energy characteristics of the binary basis unit 410 and the quantum wells 412, 414 of FIG. 4A in greater detail. As shown in FIG. 4C, irradiation of the first quantum well 412 results in a finite absorption of radiation by the material of the first quantum well 412. The absorption of the radiation results in a transition of electrons from a lower energy level (E1) 432" to an upper energy level (E2) 422". Similarly, irradiation of the second quantum well 414 results in a finite absorption of radiation by the material of the second quantum well 414. Again, the transition from E1' to E2' results in a transition of electrons from a lower energy level (E1') 434" to an upper energy level (E2') 424". These transitions are induced by optical-electric fields 270 that are perpendicular to the layers of the material. The perpendicular optical-electric field 270 corresponds to parallel light propagation.

When a plurality of quantum wells 412, 414 are stacked together but separated by relatively thick barriers, a multiple quantum well (MQW) is formed as an aggregate of the stacked, individual quantum wells 412, 414. Typically, due to the relatively thick barriers, each of the quantum wells 412, 414 maintains its own absorption characteristics with very little effect on adjacent quantum wells 412, 414. However, when barrier thicknesses are reduced, the electron wave functions in each well 412, 414 begin to spread into adjacent wells 412, 414. The spreading of the electron wave functions into adjacent wells results in degenerate energy levels 420, 430 that are common to all of the quantum wells 412, 414. In other words, if there are N quantum wells in a given structure, then there will be N slightly-separated energy levels that form an upper miniband 420 and N slightly-separated energy levels that form a lower miniband 430. Optical transitions can initiate from any one of the N slightly-separated energy levels in the lower miniband 430 to any one of the N slightly-separated energy levels in upper miniband 420 with certain oscillator strength.

In a specific example, if two quantum wells 412, 414 are of different sizes (e.g., different well width, different well depth, or both), then each quantum well 412, 414 has a different quantized energy level (e.g., E1 to E2 for the first well, and E1' to E2' for the second well). The different quantized energy levels result in different absorption energies by each of the quantum wells 412, 414 when the quantum wells 412, 414 are far apart. When the sizes of the wells are sufficiently different, the two absorption energies may be separated from each other, resulting in two distinct absorption peaks. By joining the two quantum wells 412, 414 together using a relatively thin inter-well barrier 450 to form a binary basis unit 410, the original energy levels change into degenerate common energy levels (e.g., e1, e2, e3, and e4) 420', 430' in the binary basis unit 410. The four possible new transitions (e.g., e1 to e3, e1 to e4, e2 to e3, and e2 to e4) create four absorption peaks. Since the separation between e1 and e2 is relatively small, the four peaks typically group into two widely separated pairs of peaks. The aggregation of additional binary basis units 410 results in a superlattice unit 310 having a greater number of degenerate energy levels. The increasing number of degenerate energy levels (as shown, for example, by FIG. 4A) results in a relatively continuous spectrum. Since the quantum wells having binary basis units 410 are further discussed in U.S. Pat. No. Re 34,649, further discussion of binary basis units 410 is omitted here.

As shown from FIGS. 1A through 4C, since the wavelength selectivity is built into each QGIP element 110, the operation of the QGIP spectrometer 100 is simple and reliable. Additionally, due to the inherent characteristics of the QGIP elements 110, the QGIP spectrometer 100 is portable, small, and light. Furthermore, the QGIP spectrometer 100 need not be calibrated in the field because the wavelength selectivity is fabricated into each QGIP element 110. In this regard, many deficiencies associated with conventional spectrometers are addressed by the QGIP spectrometer 100 as shown and described above.

Figure 5:
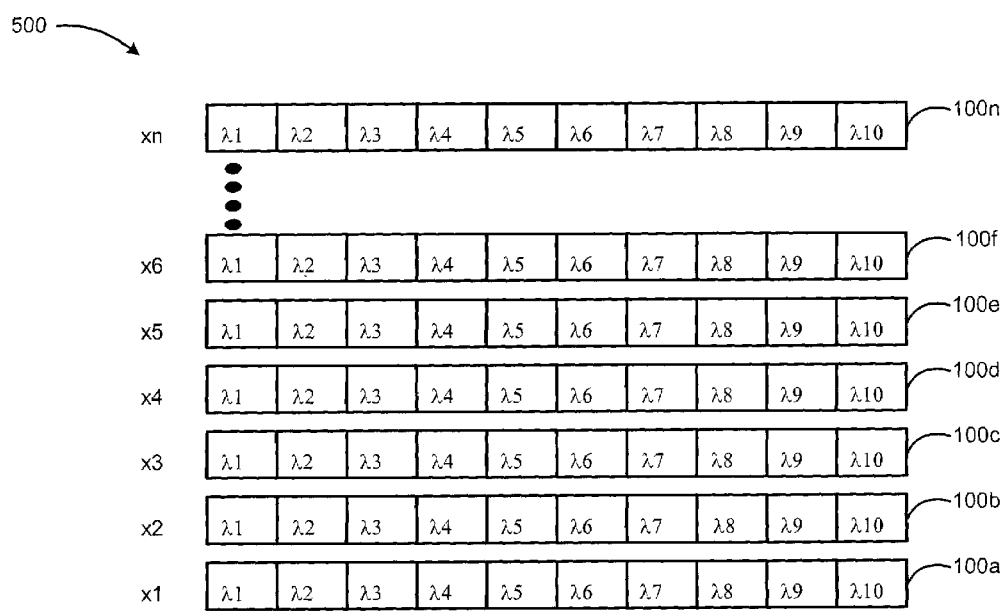
FIG. 5 is a diagram showing a QGIP imager formed by concatenating multiple QGIP spectrometers.

While an individual QGIP spectrometer 100 may be used for performing spectroscopic measurements, several QGIP spectrometers 100 may be combined to create imaging systems. For example, FIG. 5 shows a QGIP imager 500 formed by concatenating multiple QGIP spectrometers 100a . . . 100n (hereinafter simply referred to in the aggregate as "QGIP spectrometer(s) 100"). As shown in FIG. 5, the two-dimensional array of QGIP spectrometers 100 may yield spatial images as well as spectra for a particular scene. If many rows of QGIP spectrometers 100, from 1 to n, are arranged as shown, and the entire array is moved from right to left at constant speed, a scene may be sequentially imaged at different wavelengths. Alternatively, the image of the scene may be scanned into each column of the array sequentially using moving mirrors (not shown) to detect the scene at different wavelengths. Under such conditions, hyperspectral imaging may be performed.

In other embodiments, an areal image may be obtained by adding repeating columns of QGIP spectrometers 100. By reading signals from different rows and columns of the corresponding spectrometer elements, an image of a particular wavelength may be formed. This arrangement eliminates the need for a scanning mirror.

It can be appreciated from the example of FIG. 5 that the compact and robust nature of the QGIP spectrometer 100 permits use of the QGIP spectrometer 100 as a building block for many types of imaging systems. While an imaging system is specifically illustrated in FIG. 5, the QGIP spectrometer 100 may be a component part of other, more complex systems employing spectroscopic measurements.

Figure 6:
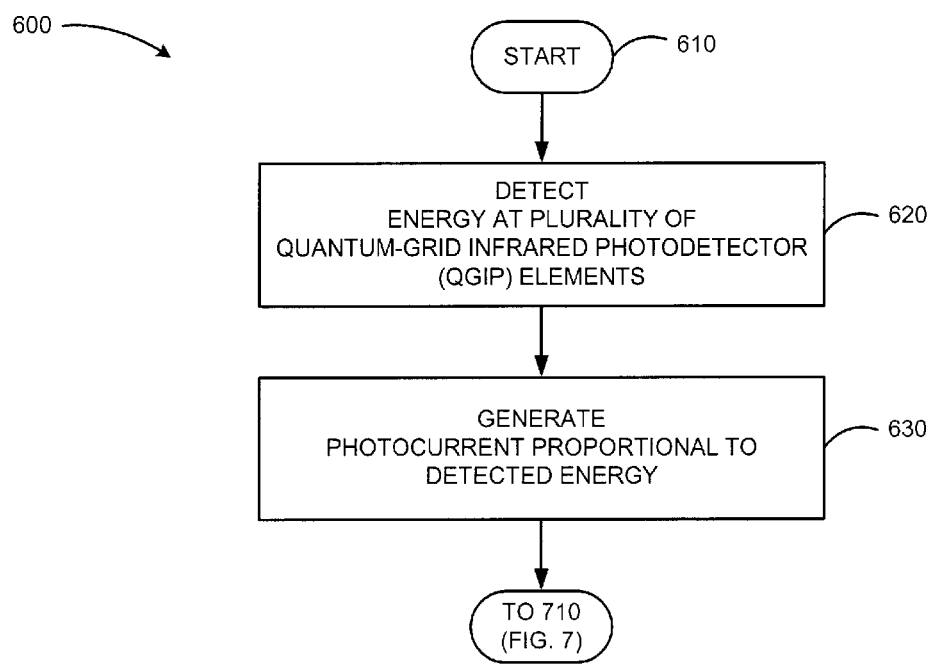
FIGS. 6 through 8 are flowcharts showing embodiments of spectroscopic processes.
Figure 7:
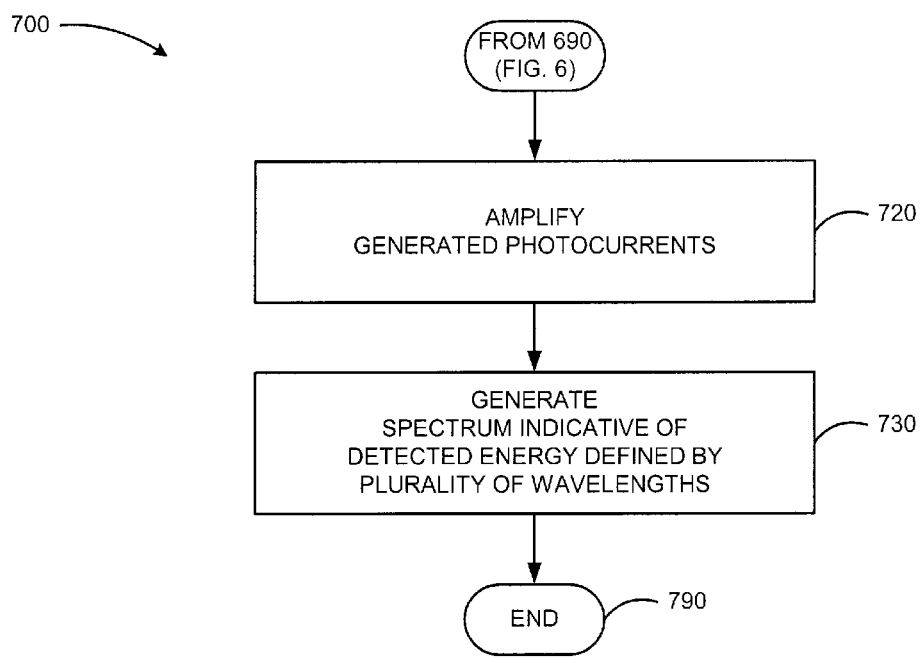
Figure 8:
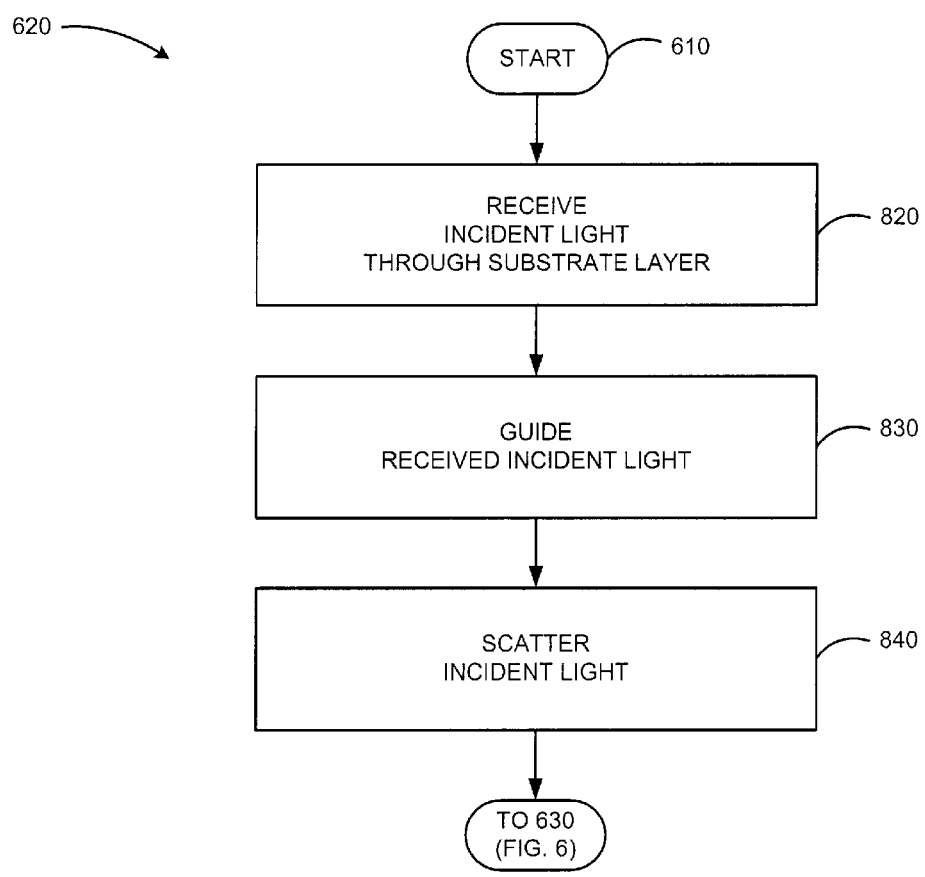

FIGS. 6 through 8 show method steps associated with spectroscopic processes 600, 700, 800. As shown in FIG. 6, one embodiment of the spectroscopic process 600 may be seen as a two-step process that begins with detecting (620) energy at a plurality of QGIP elements. The detected (620) energy is defined by the wavelength of the energy. Upon detecting (620) the energy, the process 600 continues by generating (630) photocurrents that are proportional to the detected (620) energy. In other embodiments, the spectroscopic process may continue as shown in FIG. 7. For those embodiments, the process may be seen as further including the steps of amplifying (720) the generated photocurrents and generating (730) a spectrum, which is indicative of the detected energy defined by the plurality of wavelengths.

In some embodiments, the step of detecting (620) energy may further be defined as shown in FIG. 8 to include the steps of receiving (820) incident light through a substrate layer of each of the QGIP elements. The received (820) light is then guided (830) through the QGIP elements. Thereafter, the light is scattered (840) by being reflected back through the QGIP elements. Preferably, the scattered incident light resonates through the QGIP element at a predefined frequency that preferably corresponds to an integer multiple of a half wavelength. The scattered (840) light is then absorbed by the QGIP element.

Embodiments of processes adapted for imaging may also include the step of arranging the plurality of QGIP elements into a matrix of elements. The matrix of elements may then be used to perform hyperspectral imaging.

While the process of FIG. 6 may be carried out by the structures as described in FIGS. 1 through 5, any arrangement of QGIP elements 110 may be used to carry out the process of FIG. 6.

As shown in the embodiments of FIGS. 1 through 6, many deficiencies associated with conventional spectrometers are addressed by the QGIP spectrometer 100.

Although exemplary embodiments have been shown and described, a number of changes, modifications, or alterations to the invention as described may be made. For example, while a binary basis is shown as a component element of the superlattice, it should be appreciated that a single quantum well could be used as the basis for the superlattice. Similarly, a ternary basis, a quaternary basis, or any other basis may be used as the elemental basis for the superlattice. Additionally, while specific dimensions have been provided to better illustrate example embodiments of a QGIP spectrometer, many of these dimensions may be altered without adversely effecting the invention. Likewise, while the QGIP spectrometer of FIG. 1B is shown with ten QGIP elements, the QGIP spectrometer may have any number of QGIP elements so long as at least two QGIP elements have different wavelength absorption characteristics. All such changes, modifications, and alterations should therefore be seen as being within the scope of the disclosure.

What is claimed is:

1. A spectrometer comprising:
   (1) quantum-grid infrared photodetector (QGIP) elements each adapted to detect energy at a particular range of wavelengths, the QGIP elements each being further adapted to generate a photocurrent, each photocurrent being proportional to the detected energy at the particular range of wavelengths, the particular range of wavelengths forming a continuous spectrum of wavelengths, each QGIP element comprising:
   (A) a semiconductor substrate having a planar surface, the semiconductor substrate being transparent;
   (B) a lower contact layer located on the semiconductor substrate;
   (C) quantum-well infrared photodetector (QWIP) elements optically coupled to the semiconductor substrate, each QWIP element operating as a waveguide such that incident light is directed through the QWIP element, each QWIP element further operating as a resonator such that scattered light resonates within the QWIP element, each QWIP element comprising:
      (1) a plurality of superlattices, each superlattice being adapted to detect absorption peaks, each absorption peak being defined by one of the particular ranges of wavelengths within the continuous spectrum of wavelengths, each superlattice comprising:
         (a) a plurality of binary quantum wells coupled together by inter-well barriers adapted to permit energy transfer between the binary quantum wells, each of the binary quantum wells being adapted to detect energy transition characterized by one of the detected absorption peaks;
   (D) an upper contact layer located on the QWIP elements; and
   (E) a metallic layer located on the upper contact layer.

2. A spectroscopy system comprising:
   the quantum-grid infrared photodetector (QGIP) spectrometer of claim 1 having QGIP elements, each QGIP element being adapted to detect energy at a different range of wavelengths, each QGIP element further being adapted to generate a photocurrent proportional to the detected energy;
   amplifiers, each being adapted to receive the photocurrent from one of the QGIP elements and amplify the received photocurrent;
   a processor adapted to receive the amplified photocurrents and generate a spectrum from the amplified photocurrents.

3. The system of claim 2, further comprising:
   a display adapted to display the generated spectrum.

4. The system of claim 2, wherein the spectroscopy system is a portable system.

5. The system of claim 2, further comprising:
   at least one additional QGIP spectrometer, the QGIP spectrometer and the at least one additional QGIP spectrometer being arranged as an array of QGIP spectrometers, the array of QGIP spectrometers being adapted to perform hyperspectral imaging.

6. The spectrometer of claim 1, wherein a first QGIP element comprises a superlattice having contiguous base units, each contiguous base unit being coupled to another contiguous base unit by an inter-unit barrier, the inter-unit barrier being adapted to permit energy transfer between the contiguous base units, the superlattice being adapted to absorb energy within the first range of wavelengths, the superlattice being adapted to generate a photocurrent proportional to the absorbed energy.

7. The spectrometer of claim 6, wherein each of the base units is a binary basis unit, the binary basis comprising:
   a first quantum well adapted to absorb energy at a first wavelength; and
   a second quantum well coupled to the first quantum well by an inter-well barrier, the inter-well barrier being adapted to permit energy transfer between the first quantum well and the second quantum well, the second quantum well being adapted to absorb energy at a second wavelength, the second wavelength being different from the first wavelength.

8. The spectrometer of claim 7, wherein the inter-well barrier is adapted to produce degenerate energy levels, the degenerate energy levels being a function of the absorbed energy at the first wavelength and the absorbed energy at the second wavelength.

9. The spectrometer of claim 7, wherein the inter-unit barrier is adapted to produce degenerate energy levels, the degenerate energy levels being a function of the absorbed energy at the first wavelength and the absorbed energy at the second wavelength.

10. The spectrometer of claim 1, wherein a first QGIP element comprises:
    means for absorbing energy within a range of wavelengths; and
    means for generating a photocurrent proportional to the absorbed energy.

11. The spectrometer of claim 1, wherein a second QGIP element comprises a superlattice having contiguous base units, each contiguous base unit being coupled to another contiguous base unit by an inter-unit barrier, the inter-unit barrier being adapted to permit energy transfer between the contiguous base units, the superlattice being adapted to absorb energy within the second range of wavelengths, the superlattice being adapted to generate a photocurrent proportional to the absorbed energy.

12. The spectrometer of claim 11, wherein each of the base units is a binary basis unit, the binary basis unit comprising:
    a first quantum well adapted to absorb energy at one wavelength; and
    a second quantum well coupled to the first quantum well by an inter-well barrier, the inter-well barrier being adapted to permit energy transfer between the first quantum well and the second quantum well, the second quantum well being adapted to absorb energy at a second wavelength, the second wavelength being different from the first wavelength.

13. The spectrometer of claim 12, wherein the coupling of the first quantum well to the second quantum well by the inter-well barrier produces degenerate energy levels.

14. The spectrometer of claim 12, wherein the inter-well barrier is adapted to produce degenerate energy levels, the degenerate energy levels being a function of the absorbed energy at the first wavelength and the absorbed energy at the second wavelength.

15. The spectrometer of claim 12, wherein the inter-unit barrier is adapted to produce degenerate energy levels, the degenerate energy levels being a function of the absorbed energy at the first wavelength and the absorbed energy at the second wavelength.

16. The spectrometer of claim 1, wherein a second QGIP element comprises:
    means for absorbing energy within a range of wavelengths; and means for generating a photocurrent proportional to the absorbed energy.

17. A spectrometer comprising:
quantum-grid infrared photodetector (QGIP) elements, each QGIP element being adapted to detect energy at a particular range of wavelengths, each QGIP element further being adapted to generate a photocurrent, each photocurrent being proportional to the detected energy at a corresponding particular range of wavelengths, an aggregate of the particular ranges of wavelengths forming a substantially continuous spectrum of wavelengths; and
amplifiers, each amplifier corresponding to one of the QGIP elements, each amplifier being adapted to receive the photocurrent from a corresponding QGIP element.

18. The spectrometer of claim 17, wherein each QGIP element comprises a superlattice having contiguous base units, each contiguous base unit being coupled to another contiguous base unit by an inter-unit barrier, the inter-unit barrier being adapted to permit energy transfer between the contiguous base units, the superlattice being adapted to absorb energy within a corresponding particular range of wavelengths, the superlattice being adapted to generate a photocurrent proportional to the absorbed energy.

19. The spectrometer of claim 18, wherein each of the base units is a binary basis unit, the binary basis comprising:
a first quantum well adapted to absorb energy at a first wavelength; and
a second quantum well coupled to the first quantum well by an inter-well barrier, the inter-well barrier being adapted to permit energy transfer between the first quantum well and the second quantum well, the second quantum well being adapted to absorb energy at a second wavelength, the second wavelength being different from the first wavelength.

20. The spectrometer of claim 19, wherein the inter-unit barrier is adapted to produce degenerate energy levels, the degenerate energy levels being a function of the absorbed energy at the first wavelength and the absorbed energy at the second wavelength.

21. The spectrometer of claim 19, wherein the inter-well barrier is adapted to produce degenerate energy levels, the degenerate energy levels being a function of the absorbed energy at the first wavelength and the absorbed energy at the second wavelength.

22. The spectrometer of claim 17, wherein each QGIP element comprises:
means for absorbing energy within a range of wavelengths; and
means for generating a photocurrent proportional to the absorbed energy.

23. The spectrometer of claim 17, wherein each QGIP element comprises:
a semiconductor substrate having a planar surface, the semiconductor substrate being transparent;
a lower contact layer located on the semiconductor substrate;
quantum-well infrared photodetector (QWIP) elements optically coupled to the semiconductor substrate, each QWIP element operating as a waveguide such that incident light is directed through the QWIP element, each QWIP element further operating as a resonator such that scattered light resonates within the QWIP element, each QWIP element comprising:
(1) a plurality of superlattices, each superlattice being adapted to detect absorption peaks, each absorption peak being defined by one of the particular ranges of wavelengths within the continuous spectrum of wavelengths, each superlattice comprising:
(a) a plurality of binary quantum wells coupled together by inter-well barriers adapted to permit energy transfer between the binary quantum wells, each of the binary quantum wells being adapted to detect energy transition characterized by one of the detected absorption peaks;
an upper contact layer located on the QWIP elements; and
a metallic layer located on the upper contact layer.

24. The spectrometer of claim 23, wherein each QWIP element comprises: superlattices, each superlattice being adapted to detect absorption peaks, each absorption peak being defined by one of the particular ranges of wavelengths within the continuous spectrum of wavelengths.

25. The spectrometer of claim 24, wherein each superlattice comprises: binary quantum wells coupled together by inter-well barriers, each inter-well barrier being adapted to permit energy transfer between the binary quantum wells, each of the binary quantum wells being adapted to detect energy transition characterized by one of the detected absorption peaks.

26. A method for performing spectroscopy, the method comprising:
detecting energy at a plurality of quantum-grid infrared photodetector (QGIP) elements, the detected energy being defined by a plurality of wavelengths comprising a continuous spectrum; and
generating photocurrents, each photocurrent being proportional to the detected energy at one of the plurality of wavelengths.

27. The method of claim 26, wherein the detecting of energy at the plurality of QGIP elements comprises:
receiving incident light through a substrate layer of each of the QGIP elements;
guiding the received incident light through the QGIP elements;
scattering the incident light by reflecting the incident light back through the QGIP elements, the scattering being a resonant scattering of incident light at a predefined wavelength.

28. The method of claim 26, further comprising:
amplifying the generated photocurrents; and
generating a spectrum indicative of the detected energy defined by the plurality of wavelengths.

29. The method of claim 26, further comprising:
arranging the plurality of QGIP elements into a matrix; and
performing hyperspectral imaging using the matrix of QGIP elements.

* * * * *